United States Patent [19]

Porter

[11] Patent Number: 5,574,627
[45] Date of Patent: Nov. 12, 1996

[54] APPARATUS FOR PREVENTING THE FORMATION OF CONDENSATION ON SUB-COOLED INTEGRATED CIRCUIT DEVICES

[75] Inventor: Warren W. Porter, Escondido, Calif.

[73] Assignee: AT&T Global Information Solutions Company, Dayton, Ohio

[21] Appl. No.: 506,155

[22] Filed: Jul. 24, 1995

[51] Int. Cl.⁶ .................................................... H05K 7/20
[52] U.S. Cl. ........................ 361/719; 62/150; 165/104.24; 219/209; 257/715; 361/699
[58] Field of Search ............................ 62/51.1, 150, 51.2, 62/259.2; 219/200, 201, 209, 210; 165/80.4, 104.21, 104.24, 104.33; 257/713–715; 174/16.1, 15.1, 16.3; 361/717–719, 689, 699, 700, 701, 704, 705

[56] References Cited

U.S. PATENT DOCUMENTS

| 3,289,046 | 11/1966 | Carr | 317/101 |
| 4,374,316 | 2/1983 | Inamori | 219/209 |
| 4,739,382 | 4/1988 | Blouke | 357/28 |
| 4,897,762 | 1/1990 | Daikoku | 361/382 |
| 5,331,273 | 7/1994 | Schneider | 324/158.1 |
| 5,365,749 | 11/1994 | Porter | 62/259.2 |

Primary Examiner—Gerald P. Tolin
Attorney, Agent, or Firm—James M. Stover

[57] ABSTRACT

Resistive ink elements are applied to the exposed surfaces of thin sections or thermal insulation provided to cooled integrated circuit devices within a computer system. The insulation is made thinner than required to prevent the formation of condensation upon the exposed surfaces of the insulation in order to accommodate space limitations within the computer system. The resistive ink elements generate heat upon the application of an electrical current thereto to warm the exposed surfaces of the insulation to a temperature above the dew point of the ambient environment within the computer system, thereby preventing the formation of condensation on the surfaces on the insulation.

6 Claims, 3 Drawing Sheets

APPARATUS FOR PREVENTING THE FORMATION OF CONDENSATION ON SUB-COOLED INTEGRATED CIRCUIT DEVICES

The present invention relates to cooling systems for computer systems and, more particularly, to means for preventing the formation of condensation on cooled components within a computer system.

BACKGROUND OF THE INVENTION

The increase in circuit density and operating frequency of integrated circuits and multi-chip modules utilized in present day computer systems has resulted in an exponential increase in the power dissipated by those components. For example, just a few years ago the maximum power generated by a typical complementary metal oxide semiconductor (CMOS) central processor unit (CPU) utilized within a personal computer was in the neighborhood of two watts. Currently, the Intel Corporation Pentium™ processor dissipates an estimated sixteen watts, and the next generation Intel Corporation processor is estimated to generate near thirty watts. Cooling arrangements must be provided to prevent damage to these integrated circuits from the high temperatures generated by the devices.

In addition to cooling to prevent damage resulting from overheating, it is known that a CMOS circuit will operate at higher clock speeds as the circuit temperature is lowered. In some cases the processor frequency of CMOS processor has been improved to near 300% through the cooling of the processor die to a temperature of approximately −200° C. Many methods for sub-cooling processors and other computer components are known. One such cooling system comprises a plurality of hollow cold plates which are attached to the processors, modules or other components to be cooled. A liquid coolant is circulated from a refrigeration unit through connecting conduits to the cold plates to effectuate cooling of the attached components. Other known cooling methods include directing a cooling airflow onto components requiring cooling, sealing the computer cabinetry and refrigerating the interior of the cabinet, immersing components in a coolant such as liquid nitrogen, or interfacing components with a Peltier TEC (thermal electric cooling) device.

Cooling of components to a temperature less than the local dew point presents certain difficulties in that condensation may form on the cold elements of the cooling system, such as the conduits, cold plates, sub-cooled components and structures to which the elements of the cooling system or the sub-cooled components are attached. This condensation can cause temporary or permanent damage to electrical components within the computer system.

One solution to this condensation problem is to surround the sub-cooled components with appropriate insulation. Unfortunately, providing insulation around cooling system elements and sub-cooled components increases the minimum distance between components and complicates computer component arrangement and cabinet design.

Increasing the distance between components is contrary to the desire of designers to minimize the distance between components within high frequency computing systems to provide appropriately short signal propagation paths. Of particular concern is the close spacing between printed circuit boards which are plugged into a common printed circuit backpanel which serves as a system bus. Short signal transmission paths are required to prevent undesirable transmission line effects and improve total system throughput.

In a sub-cooled computing system, the need for minimizing signal path lengths and component spacing precludes the use of appropriately thick insulators between printed circuit boards or other sub-cooled components that is required to prevent the formation of condensation.

OBJECTS OF THE INVENTION

It is therefore an object of the present invention to provide a new and useful apparatus for preventing the formation of condensation on sub-cooled integrated circuit devices.

It is another object of the present invention to provide such a apparatus for applying heat to the surface of a sub-cooled integrated circuit device to prevent the formation of condensation on the surface.

It is yet another object of the present invention to provide a new and useful method and apparatus for reducing the need for insulation around sub-cooled integrated circuit devices within a computer system.

It is still a further object of the present invention to provide a new and useful method and apparatus for reducing spacing between sub-cooled integrated circuit devices within a computer system.

SUMMARY OF THE INVENTION

The formation of frost or condensation within computer cabinetry can cause temporary or permanent damage to electrical components within the computer system. The utilization of insulation around integrated circuit devices, such as processors and other integrated circuit devices, which are cooled to a temperature below the dew point of the ambient environment within the computer cabinetry to prevent the formation of frost or condensation is not practical since it would require increased spacing between components within the cabinetry and possibly larger cabinetry for the computer system.

In one embodiment of the present invention, there is provided insulation packaging for a sub-cooled integrated circuit device. This packaging comprising a thermal insulator encasing the integrated circuit device together with cooling system elements affixed to the integrated circuit device. The thermal insulation has an inner surface applied to the integrated circuit device and elements of the cooling system in contact with the integrated circuit device, and an outer surface exposed to the ambient environment. To accommodate spacing limitations, sections of the insulator are made thinner than required to prevent the outer surface of the insulator from being cooled to a temperature below the dew point of the ambient environment. A heating element is provided to portions of the outer surface of the insulator, which portions of said outer surface are cooler than the dew point to prevent the formation of condensation.

The above and other objects, features, and advantages of the present invention will become apparent from the following description and the attached drawings.

DETAILED DESCRIPTION OF THE PREFERRED EMBODIMENT

Figure 1:
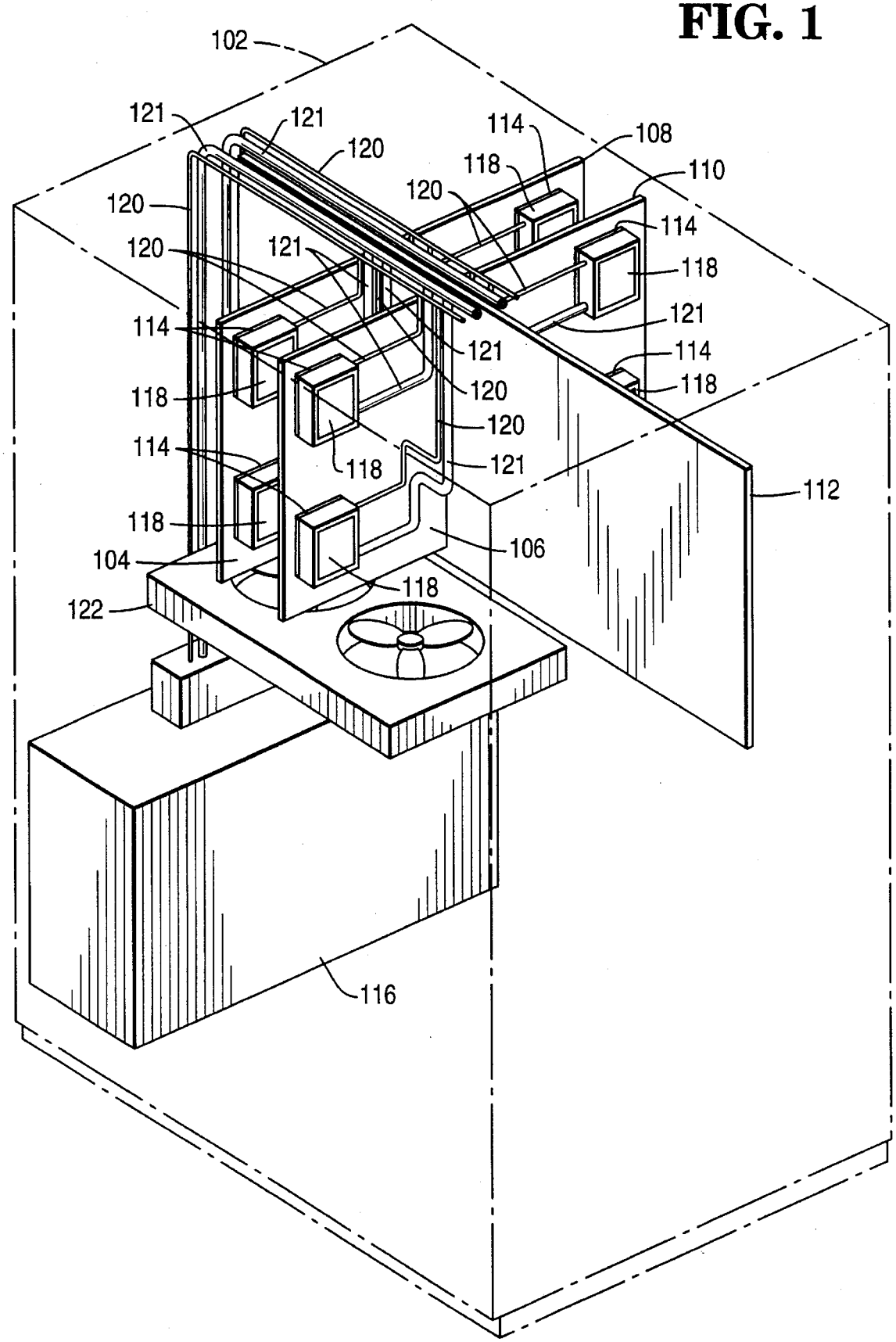
FIG. 1 is a perspective view of a processor cabinet including a plurality of printed circuit boards and refrigeration system for cooling printed circuit board components.

Referring now to FIG. 1, there is seen a typical processor cabinet 102, shown in outline, which houses the components of a multiple processor computer system and includes a cooling system in accordance with the present invention. However, only those components necessary for an understanding of the present invention are shown and discussed herein. The processor cabinetry may additionally house disk drives, power supplies, memory boards and other structures not shown in FIG. 1.

The computer system includes a plurality of processor boards, four of which are shown. These boards, identified by reference numerals 104, 106, 108 and 110, each include electrical contacts along one edge which are press fitted into mating connectors secured to the surface of a system backpanel 112. The backpanel provides common connections for the transmission of power, control and data signals between the various components of the computer system. The processor boards, which will be described in greater detail below with reference to FIG. 2, each include two processors 114. Also shown in FIG. 1 is a typical fan panel 122 that generates an air flow directed upward across the processor boards and other components within the cabinet.

The primary components of the cooling system shown in FIG. 1 include a refrigeration compressor unit 116, a heat exchanger 118 affixed to each processor 114, and refrigeration supply and return conduits 120 and 121, respectively, connecting each heat exchanger 118 with refrigeration compressor unit 116. The refrigeration compressor unit may be a single or two compressor compound, or cascade, vapor compression phase system which is located in the bottom of cabinet 102 to facilitate disconnection of the compressor unit from the conduit system for removal and service or replacement. The refrigeration compressor system provides pressurized coolant to each of the heat exchangers.

Figure 2:
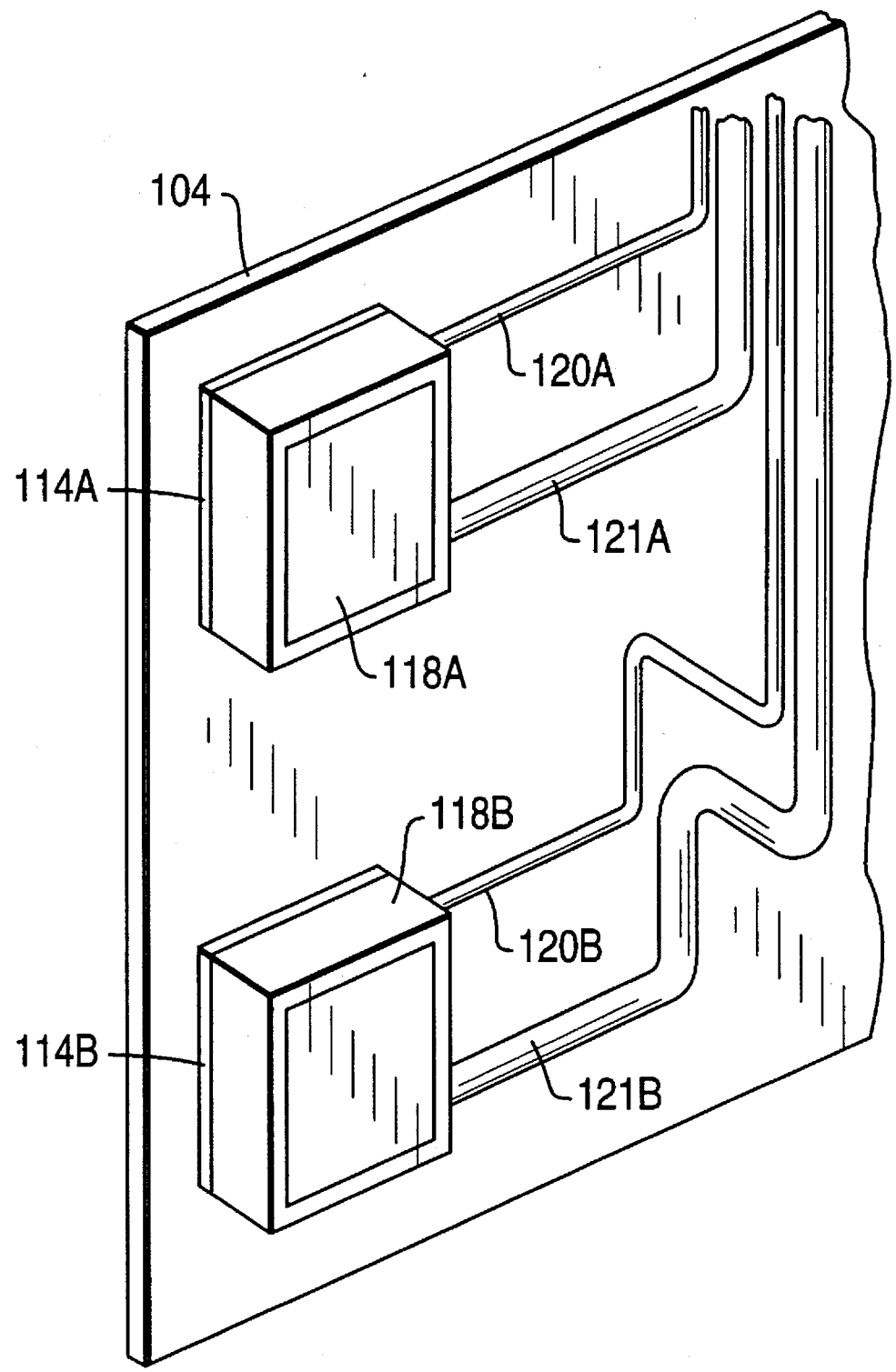
FIG. 2 is a printed circuit board subassembly, shown in perspective view, including two CPUs and corresponding CPU heat exchanger components of the cooling system shown in FIG. 1

Processor board 104 is shown in perspective view in FIG. 2. The processor board is a printed circuit board to which is attached two CPUs, identified by reference numerals 114A and 114B, respectively, as well as other circuit elements which are not shown. It should be noted that although the processor boards are shown including two CPUs, one, two or more processors can be accommodated on each processor board and the cooling system, described herein, designed accordingly. Attached to each CPU is a heat exchanger, identified by reference numerals 118A and 118B, respectively. Refrigerant supply conduits 120A and 120B each terminate into respective heat exchanger assemblies 118A and 118B to provide for the delivery of pressurized liquid coolant from the refrigeration compressor 116 to the heat exchanger assemblies, while refrigerant return conduits 121A and 121B provide for the return of coolant from respective heat exchanger assemblies 118A and 118B to the refrigeration compressor unit 116. In the embodiment shown, the outside diameter of the refrigerant supply conduits is about 1/16 of an inch, much smaller than the diameter of the refrigerant return conduits, which have an outside diameter of about 3/8 of an inch.

Chilled component surfaces susceptible to the formation of condensation or frost within the system shown in FIGS. 1 and 2 include compressor unit 116, refrigerant supply and return conduits 120 and 121, heat exchangers 118, integrated circuit devices (CPUs) 114, and those portions of printed circuit boards 104, 106, 108 and 110 which are in contact with integrated circuit devices 114.

Figure 3:
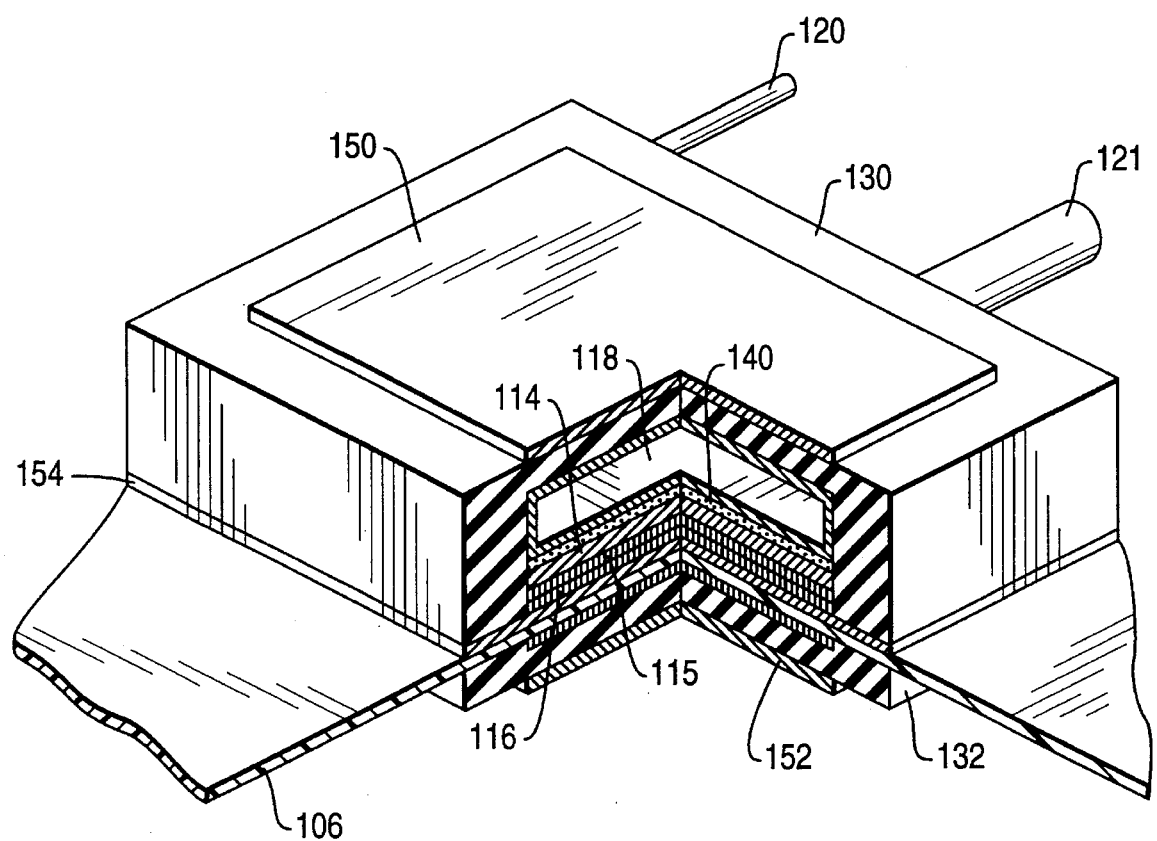
FIG. 3 is a perspective view, partially cut away, of a sub-cooled integrated circuit device including structure for insulating and preventing condensation on the sub-cooled integrated circuit device in accordance with the present invention.

FIG. 3 is a perspective view, partially cut away, of a sub-cooled integrated circuit device. CPU 114, including structure for insulating and preventing condensation on CPU 114 in accordance with the present invention. CPU 114 is shown plugged into a socket assembly 116 which is permanently soldered to printed circuit board 106. Socket pins 115 extend from socket assembly 116 into and through printed circuit board 106.

Heat exchanger 118 is secured to the upper surface of CPU 114, a thermal compound 140 provided between the CPU and heat exchanger to improve thermal conductivity between the two components. The CPU/heat exchanger assembly is thermally insulated from the ambient environment by insulation which encases the assembly. Upper insulator 130 covers CPU 114, socket assembly 116, heat exchanger 118 and all other components mounted to the top surface of printed circuit board 106. Lower insulator 132 is provided on the bottom surface of printed circuit board 106 to cover the socket pins 115. Socket pins 115, which protrude through the board, are chilled through thermal contact with the CPU pins.

The insulators 130 and 132, as shown in FIG. 3, are each seen to comprise a thin section of insulation above and below the CPU and heat exchanger, while the insulation around the perimeter of the CPU and heat exchanger is substantially thicker than the insulation above and below the CPU and heat exchanger. The thin sections of insulation above and below the CPU and heat exchanger are required to permit close spacing of multiple printed circuit boards within the processor cabinetry. However, at significantly low temperatures the thin sections of insulation do not provide thermal isolation adequate enough to prevent the formation of condensation on the cool, outside, surfaces of the thin sections.

To prevent the formation of insulation on the external surfaces of the thin sections of insulation, integral surface heaters 150 and 152 are provided on the top surface of upper insulator 130, and the lower surface of insulator 132, respectively. An additional surface heater 154 may also be provided between upper insulator 130 and printed circuit board 106 to prevent the formation of condensation on the printed circuit board surfaces adjacent the cooled CPU and heat exchanger assembly. These integral surface heaters may be implemented in several ways. The heaters may be commercially available custom etched resistive conductors on an insulative substrate which could be adhesively bonded to the insulator surfaces, or imbedded in the insulation. Alternatively, the integral surface heaters can be small gauge resistive wires arranged in a suitable pattern and secured to the insulator surfaces with double-sided adhesive tape. Semiconductive-elastomeric rubber or other semi-conductive compounds may also be employed within the integral surface heaters.

Surface heaters 150, 152 and 154 generate heat upon the application of an electrical current thereto to prevent the formation of condensation on the surfaces of the insulators.

Electric current may be provided to the integral surface heaters 150, 152 and 154 from already available printed circuit board power supply (not shown). An interlock circuit may optionally be included in the current supply circuitry to the heaters to prevent overheating should the CPU cooling system fails or be disabled.

Insulators 130 and 132 and surface heating elements 150, 152 and 154 have omitted from FIGS. 1 and 2 for clarity.

It can thus be seen that there has been provided by the present invention a new and useful method and apparatus for preventing the formation of condensation on sub-cooled integrated circuit devices. The invention as described above applies heat to the surfaces of the insulation surrounding a sub-cooled integrated circuit device to prevent the formation of condensation on chilled surfaces, thereby reducing the need for insulation around the integrated circuit device and reducing spacing requirements between the sub-cooled devices.

Although the presently preferred embodiment of the invention has been described, it will be understood that various changes may be made within the scope of the appended claims.

What is claimed is:

1. Apparatus comprising:
   an integrated circuit device;
   a heat exchanger comprising a thermally conductive material, said heat exchanger with said thermally conductive material being in thermal contact with said integrated circuit device, said heat exchanger being connected with a cooling system for cooling said integrated circuit device to a temperature below the dew point of an ambient environment;
   thermal insulation encasing said integrated circuit device and said heat exchanger, said thermal insulation having an inner surface in contact with said integrated circuit device and said heat exchanger, and an outer surface exposed to the ambient environment; and
   a heating element disposed on portions of the outer surface of said insulation which are cooler than said dew point.

2. In a computer system including an integrated circuit device mounted to a printed circuit board, said integrated circuit device being mounted to a first surface of said printed circuit board, and a cooling system for cooling said integrated circuit device, said cooling system including cooling system elements in thermal contact with said integrated circuit, said integrated circuit device being chilled to a temperature below the dew point of an ambient environment, the improvement comprising:
   a first thermal insulator secured to said first surface of said printed circuit board and covering said integrated circuit device, said first thermal insulator having an inner surface in contact with said integrated circuit device and said cooling system elements in thermal contact with said integrated circuit device, and an outer surface exposed to the ambient environment;
   a first heating element disposed on the outer surface of said first thermal insulator, said heating element generating heat upon the application of an electrical current thereto to prevent the formation of condensation on said first thermal insulator.

3. The improvement according to claim 1, wherein said integrated circuit device includes signal pins which extend through said printed circuit board to a second surface of said printed circuit board, the improvement further comprising:
   a second thermal insulator secured to said second surface of said printed circuit board and covering said signal pins, said second thermal insulator having an inner surface in contact with said second surface of said printed circuit board, and an outer surface exposed to the ambient environment;
   a second heating element disposed on the second surface of said second thermal insulator, said second heating element generating heat upon the application of an electrical current thereto to prevent the formation of condensation on said second thermal insulator.

4. The improvement according to claim 3, further comprising:
   a third heating element placed between said first thermal insulator and said printed circuit board, said third heating element generating heat upon the application of an electrical current thereto to prevent the formation of condensation on said printed circuit board.

5. The improvement according to claim 1, wherein:
   said integrated circuit device is rectangular-shaped, having a bottom surface mounted on said printed circuit board, a top surface, and four side surfaces;
   said first thermal insulator is rectangular-shaped having a top section, and four side sections corresponding to said top and side surfaces of said integrated circuit device, said top section have a thickness inadequate to prevent the outer, top surface of said first thermal insulator from being cooled to a temperature below said dew point; and
   said first heating element is disposed on the top surface of said first thermal insulator.

6. The improvement according to claim 5, wherein:
   said lower thermal insulator is rectangular-shaped, said second thermal insulator having a thickness which is inadequate to prevent the outer surface of said second thermal insulator from being cooled to a temperature below said dew point; and
   said second heating element is disposed on the outer surface of said second thermal insulator.

\* \* \* \* \*